United States Patent
Ma

(10) Patent No.: US 12,417,947 B2
(45) Date of Patent: Sep. 16, 2025

(54) METAL GRINDING PRETREATMENT IN SEMICONDUCTOR DEVICE FABRICATION METHOD

(71) Applicant: CHANGXIN MEMORY TECHNOLOGIES, INC., Hefei (CN)

(72) Inventor: Ke Ma, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 612 days.

(21) Appl. No.: 17/813,654

(22) Filed: Jul. 20, 2022

(65) Prior Publication Data
US 2023/0307294 A1   Sep. 28, 2023

Related U.S. Application Data

(63) Continuation of application No. PCT/CN2022/093497, filed on May 18, 2022.

(30) Foreign Application Priority Data

Mar. 25, 2022 (CN) .......................... 202210300105.3

(51) Int. Cl.
*H01L 21/768* (2006.01)
*H01L 21/02* (2006.01)
(Continued)

(52) U.S. Cl.
CPC .. *H01L 21/76883* (2013.01); *H01L 21/02074* (2013.01); *H01L 21/3212* (2013.01);
(Continued)

(58) Field of Classification Search
CPC ........... H01L 21/76883; H01L 21/7684; H01L 21/02074
See application file for complete search history.

(56) References Cited

U.S. PATENT DOCUMENTS 6,399,486 B1   6/2002   Chen et al.
6,436,832 B1   8/2002   Ma et al.
(Continued)

FOREIGN PATENT DOCUMENTS

CN   1741255 A   3/2006
CN   1906262 A   1/2007
(Continued)

OTHER PUBLICATIONS

International Search Report cited in PCT/CN2022/093497 mailed Oct. 25, 2022, 9 pages.

*Primary Examiner* — Daniel Luke
(74) *Attorney, Agent, or Firm* — SYNCODA LLC; Feng Ma

(57) ABSTRACT

The present disclosure relates to the technical field of semiconductors, and provides a method of manufacturing a semiconductor structure and a semiconductor structure. The method of manufacturing a semiconductor structure includes: providing an initial structure, wherein the initial structure includes a dielectric layer and an initial metal interconnect structure, the initial metal interconnect structure penetrates the dielectric layer and covers a top surface of the dielectric layer; treating an exposed surface of the initial metal interconnect structure by using a first gas; cleaning the exposed surface of the initial metal interconnect structure by using a first liquid; and grinding to remove a partial structure of the initial metal interconnect structure, wherein a retained part of the initial metal interconnect structure forms a metal interconnect structure.

12 Claims, 6 Drawing Sheets

(51) Int. Cl.
  *H01L 21/321* (2006.01)
  *H01L 23/532* (2006.01)

(52) U.S. Cl.
  CPC .... *H01L 21/7684* (2013.01); *H01L 21/76886*
    (2013.01); *H01L 21/76879* (2013.01); *H01L 23/53238* (2013.01)

(56) References Cited

U.S. PATENT DOCUMENTS

| | | |
|---|---|---|
| 7,141,495 B2 | 11/2006 | Peng et al. |
| 7,288,021 B2 | 10/2007 | De Rege Thesauro et al. |
| 2003/0032292 A1* | 2/2003 | Noguchi ........... H01L 21/67046 438/692 |

FOREIGN PATENT DOCUMENTS

| | | |
|---|---|---|
| CN | 101872722 A | 10/2010 |
| CN | 102005406 A | 4/2011 |
| CN | 111029299 A | 4/2020 |

\* cited by examiner

METAL GRINDING PRETREATMENT IN SEMICONDUCTOR DEVICE FABRICATION METHOD

CROSS-REFERENCE TO RELATED APPLICATIONS

This is a continuation of International Application No. PCT/CN2022/093497, filed on May 18, 2022, which claims the priority to Chinese Patent Application No. 202210300105.3, titled "METHOD OF MANUFACTURING SEMICONDUCTOR STRUCTURE AND SEMICONDUCTOR STRUCTURE" and filed on Mar. 25, 2022. The entire contents of International Application No. PCT/CN2022/093497 and Chinese Patent Application No. 202210300105.3 are incorporated herein by reference.

TECHNICAL FIELD

The present disclosure relates to, but is not limited to, a method of manufacturing a semiconductor structure and a semiconductor structure.

BACKGROUND

To reduce a resistor capacitor (RC) delay of interconnect leads in the back-end process of an integrated circuit, copper is usually used as an interconnect material due to its low resistance value and good resistance to electron migration. Copper is generally formed by an electroplating process.

In the electroplating process, a wafer is placed in an electroplating solution and a metal layer is formed on the wafer by electrolysis with the electroplating solution. The electroplating solution is usually a salt solution of pre-plated metal, which is generally acidic. After the electroplating, if the electroplating solution is not removed in time or completely, the residual acid liquid may oxidize a part of the metal on the top surface of a metal plating layer to a metal oxide. The metal oxide is too hard to be removed by a grinding process and has poor conductivity. If the wafer with the metal oxide enters the subsequent process, significant defects may occur in the region of the wafer covered by the metal oxide in the subsequent process, resulting in a decrease in the wafer yield or even scrap of the entire wafer.

SUMMARY

An overview of the subject matter detailed in the present disclosure is provided below, which is not intended to limit the protection scope of the claims.

The present disclosure provides a method of manufacturing a semiconductor structure and a semiconductor structure.

A first aspect of the present disclosure provides a method of manufacturing a semiconductor structure, including:

providing an initial structure, wherein the initial structure includes a dielectric layer and an initial metal interconnect structure, and the initial metal interconnect structure penetrates the dielectric layer and covers a top surface of the dielectric layer;

treating an exposed surface of the initial metal interconnect structure by using a first gas, wherein the first gas has a reducibility, and a metal oxide on the exposed surface of the initial metal interconnect structure is reduced;

cleaning the exposed surface of the initial metal interconnect structure by using a first liquid; and grinding to remove a partial structure of the initial metal interconnect structure, wherein a retained part of the initial metal interconnect structure located in the dielectric layer forms a metal interconnect structure.

A second aspect of the present disclosure provides a semiconductor structure manufactured by using the method of manufacturing a semiconductor structure described above.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

The present disclosure provides a method of manufacturing a semiconductor structure and a semiconductor structure. A metal oxide on the surface of an initial metal interconnect structure is reduced by a first gas, and a first liquid is used to clean the metal oxide on the surface of the initial metal interconnect structure, thus removing the metal oxide on the top surface of the initial metal interconnect structure, which solves the problem that the metal oxide is too hard to be removed through grinding. In other words, before the semiconductor structure is ground, the metal oxide on the top surface of the initial metal interconnect structure is reduced to metal, which improves the grinding efficiency, improving the conductivity of the subsequently formed metal interconnect structure, and improves the product performance and yield.

Figure 1:
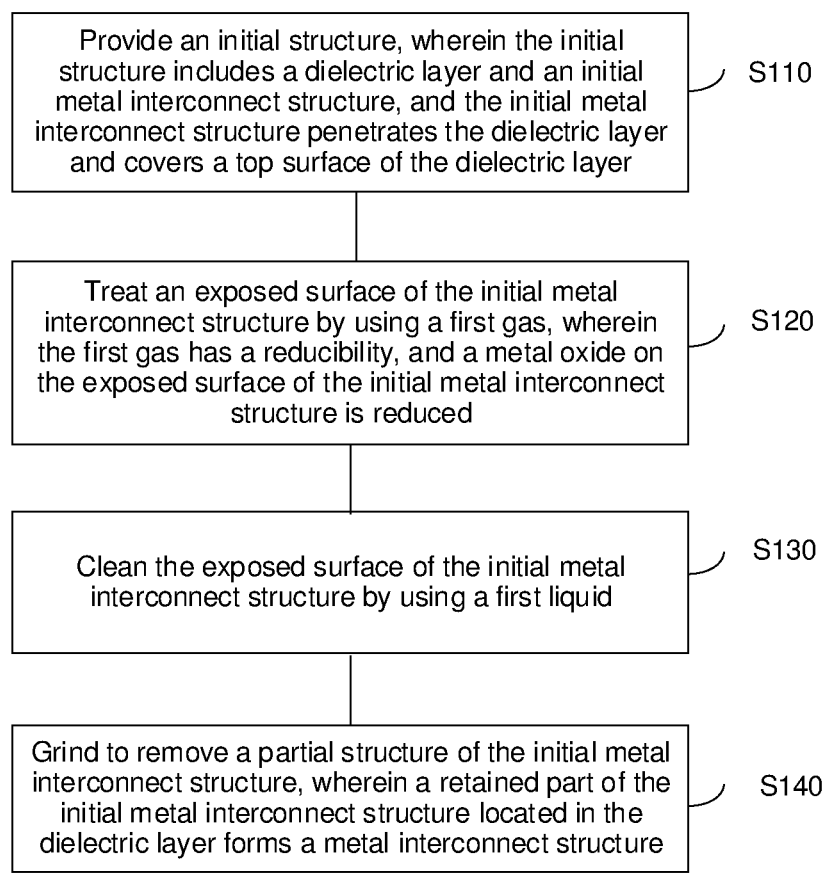
FIG. 1 is a flowchart of a method of manufacturing a semiconductor structure according to an exemplary embodiment.

As shown in FIG. 1, an exemplary embodiment of the present disclosure provides a method of manufacturing a semiconductor structure, including: Step S110: Provide an initial structure, where the initial structure includes a dielectric layer and an initial metal interconnect structure, and the initial metal interconnect structure penetrates the dielectric layer and covers a top surface of the dielectric layer.

Figure 3:
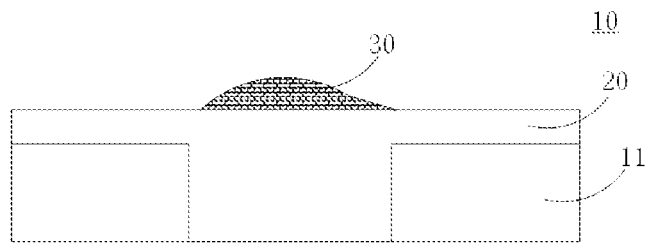
FIG. 3 is a schematic diagram of an initial structure according to an exemplary embodiment.

In this embodiment, as shown in FIG. 3, the initial structure 10 is a is semiconductor structure for a metal interconnect process. The dielectric layer 11 may be a material layer for forming semiconductor devices. Semiconductor devices are formed in the dielectric layer 11. For example, active semiconductor devices, passive semiconductor devices and the like may be formed in the dielectric layer 11. A material of the dielectric layer 11 may include at least one of silicon oxide ($SiO_2$), silicon nitride (SiN), or silicon oxynitride (SiON). For example, the dielectric layer 11 may include fluorine-doped silicon oxide, carbon-doped silicon oxide, porous silicon oxide, porous carbon-doped silicon oxide, an organic polymer, or a silicone-based polymer, but is not limited thereto.

As shown in FIG. 3, along a thickness direction of the initial structure 10, a partial structure of the initial metal interconnect structure 20 penetrates the dielectric layer 11, and a partial structure of the initial metal interconnect structure 20 covers a top surface of the dielectric layer 11. The partial structure of the initial metal interconnect structure 20 covering the top surface of the dielectric layer 11 is the structure that needs to be removed in this embodiment. A material of the initial metal interconnect structure 20 may include at least one of copper, aluminum, chromium, cadmium, nickel, or argentum.

Under the influence of the manufacturing process, in the process of forming the initial metal interconnect structure 20, materials of a partial structure of the initial metal interconnect structure 20 may be oxidized, and the oxidized materials form a metal oxide 30 (referring to FIG. 3) on the top surface of the initial metal interconnect structure 20.

In this embodiment, the material of the initial metal interconnect structure includes at least one of copper, aluminum, chromium, cadmium, nickel, or silver. Correspondingly, after the materials of the initial metal interconnect structure 20 are oxidized, the metal oxide 30 formed on the top surface of the initial metal interconnect structure 20 may include at least one of copper oxide, chromium oxide, cadmium oxide, nickel oxide, or silver oxide. The hardness of these oxides of the material of the initial metal interconnect structure 20 is greater than the hardness of the material of the initial metal interconnect is structure 20. Therefore, once the metal oxide 30 covers the top surface of the initial metal interconnect structure 20, the metal oxide 30 is difficult to remove in the subsequent process of grinding to remove the partial structure of the initial metal interconnect structure 20 covering the top surface of the dielectric layer 11.

Step S120: Treat an exposed surface of the initial metal interconnect structure by using a first gas, where the first gas has reducibility, and a metal oxide on the exposed surface of the initial metal interconnect structure is reduced.

Figure 4:
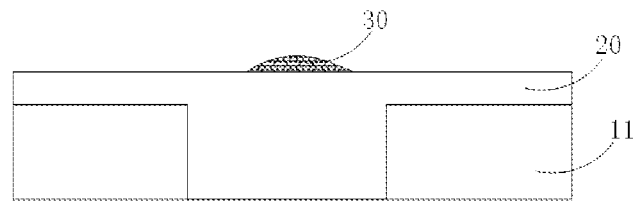
FIG. 4 is a schematic diagram of treating an initial metal interconnect structure by using a first gas according to an exemplary embodiment.

In this embodiment, as shown in FIG. 4 with reference to FIG. 3, the initial structure 10 is placed in a reaction chamber, and a first gas with reducibility is injected into the reaction chamber. Under a predetermined condition, the first gas can react with the metal oxide 30 on the exposed surface of the initial metal interconnect structure 20 to reduce a part of the metal oxide 30 to metal monomer, so as to reduce the content of the metal oxide 30 on the surface of the initial metal interconnect structure 20. For example, the first gas includes a carbon-containing gas and/or a hydrogen-containing gas. For example, according to ingredients of the metal oxide 30, the first gas may include one or more of ammonia ($NH_3$), hydrogen ($H_2$) or carbon oxide (CO).

The predetermined condition refers to a temperature condition of 200° C. to 300° C.

Step S130: Clean the exposed surface of the initial metal interconnect structure by using a first liquid.

In this embodiment, the exposed surface of the initial metal interconnect structure 20 may be sprayed with a flowing first liquid. Further, the initial structure 10 may be placed in the first liquid, so that the exposed surface of the initial metal interconnect structure 20 is fully in contact with the first liquid. The first liquid does not react with the material of the initial metal interconnect structure 20.

During implementation, the first liquid needs to be selected according to the metal oxide 30 and the metal material of the initial metal interconnect structure 20. For example, the metal oxide 30 is soluble in the first liquid, and the metal material of the initial metal interconnect structure 20 is insoluble in the first liquid. Alternatively, the first liquid reacts with the metal oxide 30. The first liquid reduces the metal oxide 30 to a metal monomer. The first liquid does not react with the metal material of the initial metal interconnect structure 20.

Figure 5:
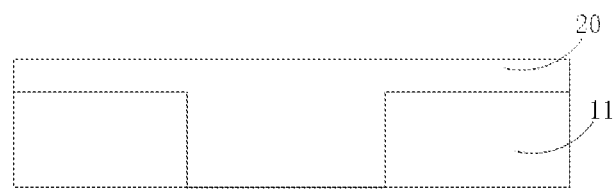
FIG. 5 is a schematic diagram of treating an initial metal interconnect structure by using a first liquid according to an exemplary embodiment.

After step S130, as shown in FIG. 5 with reference to FIG. 3, most of the remaining metal oxide 30 on the surface of the initial metal interconnect structure 20 has been removed.

Step S140: Grind to remove a partial structure of the initial metal interconnect structure, wherein a retained part of the initial metal interconnect structure located in the dielectric layer forms a metal interconnect structure.

Figure 6:
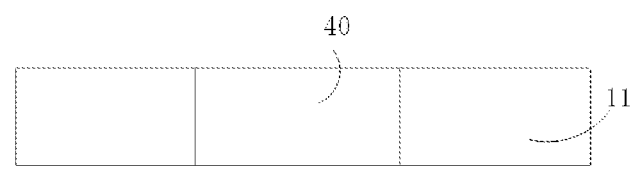
FIG. 6 is a schematic diagram of forming a metal interconnect structure through grinding according to an exemplary embodiment.

As shown in FIG. 6 with reference to FIG. 3, the initial metal interconnect structure 20 covering the top surface of the dielectric layer 11 is removed through a chemical mechanical polish (CMP) process, and the retained part of the initial metal interconnect structure 20 located in the dielectric layer 11 forms the metal interconnect structure 40.

In the method of manufacturing a semiconductor structure of this embodiment, before the initial metal interconnect structure is ground, the initial metal interconnect structure is treated by using the first gas and the first liquid in sequence, to remove the metal oxide on the surface of the initial metal interconnect structure, so that no hard metal oxide exists on the surface of the initial metal interconnect structure. This facilitates keeping a consistent grinding speed on the entire surface of the initial metal interconnect structure in the process of grinding the initial metal interconnect structure, and ensures that the surface of the formed metal interconnect structure is smooth and has no residual metal oxide. The metal interconnect structure formed in this embodiment has good electrical performance and improves the product performance and yield.

Figure 2:
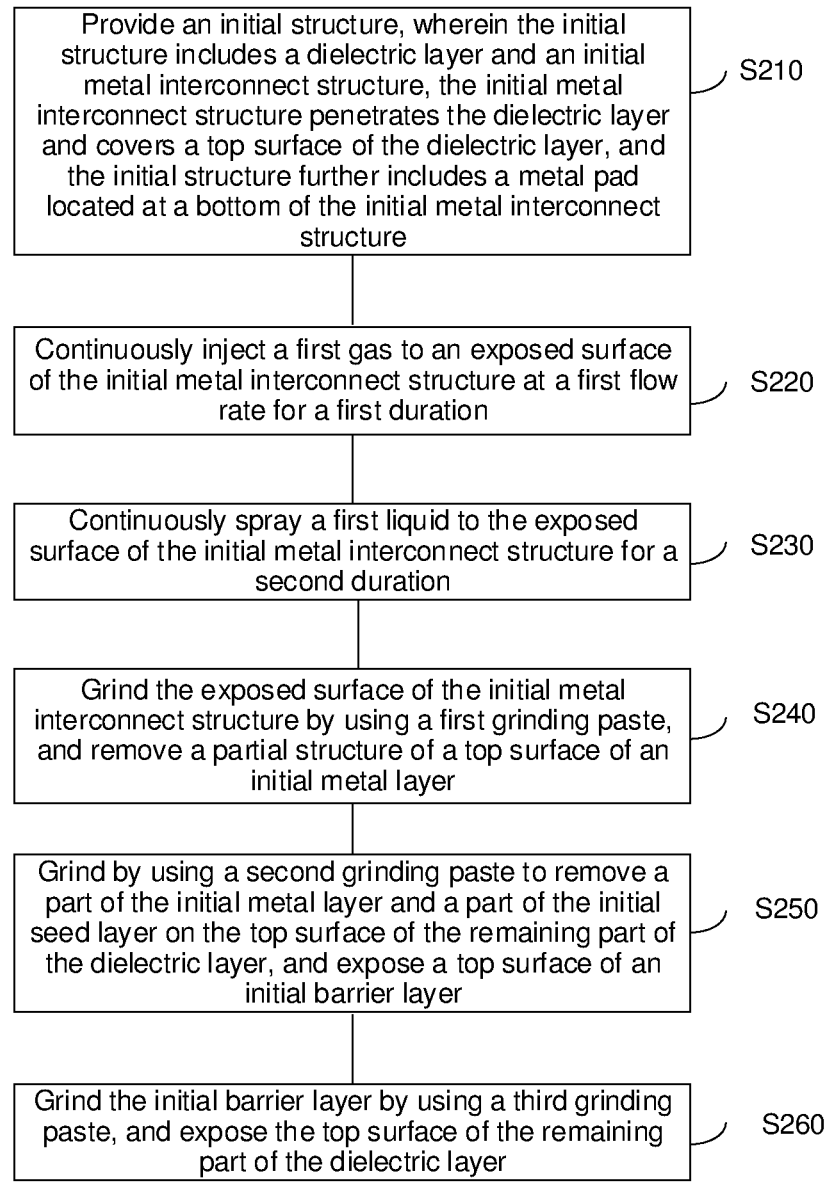
FIG. 2 is a flowchart of a method of manufacturing a semiconductor structure according to an exemplary embodiment.

As shown in FIG. 2, an exemplary embodiment of the present disclosure is provides a method of manufacturing a semiconductor structure, including:

Step S210: Provide an initial structure, where the initial structure includes a dielectric layer and an initial metal interconnect structure, the initial metal interconnect structure penetrates the dielectric layer and covers a top surface of the dielectric layer, and the initial structure further includes a metal pad located at the bottom of the initial metal interconnect structure.

Figure 7:
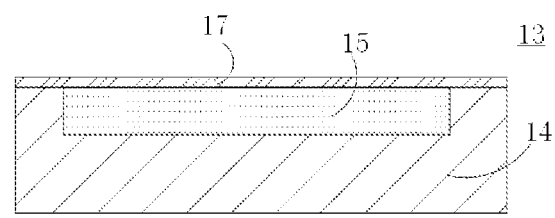
FIG. 7 is a schematic diagram of a first structure according to an exemplary embodiment.

In this embodiment, the initial structure 10 is a semiconductor structure for a metal interconnect process. The providing an initial structure 10 includes:

As shown in FIG. 7, a first structure 13 is provided first, where the first structure 13 includes a media layer 14, and a metal pad 15 is formed in the media layer 14. The metal pad 15 may be located inside the media layer 14 and covered by the media layer 14; alternatively, the metal pad 15 may be provided at the top of the media layer 14, and the media layer 14 exposes a top surface of the metal pad 15. In this embodiment, the top surface of the metal pad 15 being exposed by the media layer 14 is taken as an example for description. As shown in FIG. 7, the first structure 13 further includes a first barrier layer 17. The first barrier layer 17 is configured to cover the top surface of the metal pad 15, to prevent the metal material in the metal pad 15 from diffusing to the dielectric layer 11 deposited in the subsequent step to contaminate the dielectric layer 11.

Figure 11:
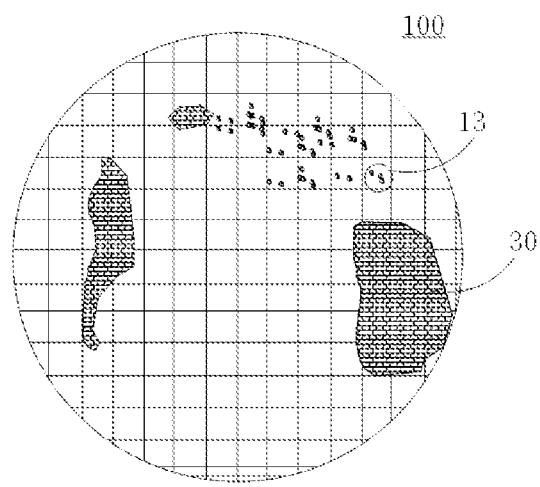
FIG. 11 is a top view of a wafer for forming an initial structure according to an exemplary embodiment.

In this embodiment, referring to FIG. 11, the first structure 13 is located in a wafer 100. The wafer 100 is a semiconductor wafer, and a material of the semiconductor wafer may include one or more of silicon (Si), germanium (Ge), silicon germanium (GeSi), or silicon carbide (SiC), or another material, for example, an III-V compound such as gallium arsenide. A material of the media layer 14 may include at least one of silicon oxide ($SiO_2$), silicon nitride (SiN) or silicon oxynitride (SiON).

Figure 8:
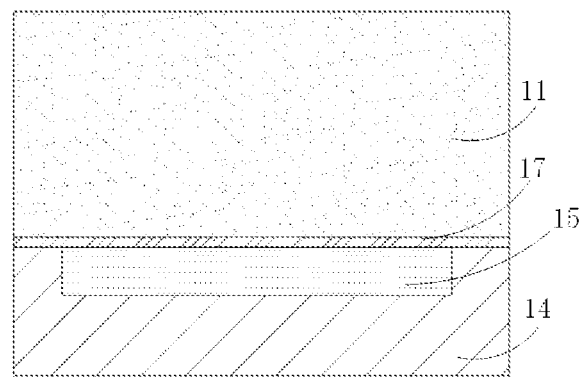
FIG. 8 is a schematic diagram of forming a dielectric layer according to an exemplary embodiment.

As shown in FIG. 8 with reference to FIG. 7, the dielectric layer 11 is deposited above the media layer 14 through chemical vapor deposition (CVD) or physical vapor deposition process (PVD), where the dielectric layer 11 covers is the first barrier layer 17.

Figure 9:
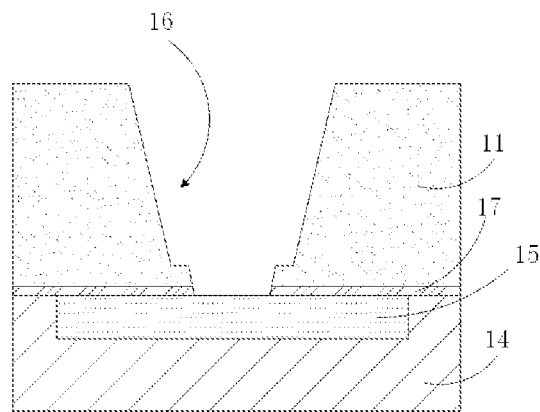
FIG. 9 is a schematic diagram of forming a first trench according to an exemplary embodiment.

Then, as shown in FIG. 9 with reference to FIG. 8, a part of the dielectric layer 11 and a part of the first barrier layer 17 are removed, to form a first trench 16. The first trench 16 exposes a part of the top surface of the metal pad 15. In this embodiment, the first trench 16 may be formed through dry etching or wet etching.

Figure 10:
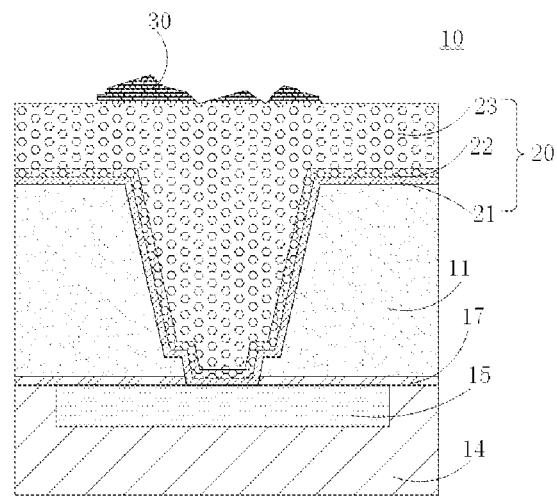
FIG. 10 is a schematic diagram of an initial structure according to an exemplary embodiment.

After the first trench 16 is formed, referring to FIG. 10, an initial barrier layer 21 is formed in the first trench 16. The initial barrier layer 21 covers the part of the top surface of the metal pad 15 exposed, a trench wall of the first trench 16, and a top surface of a remaining part of the dielectric layer 11. A material of the initial barrier layer 21 may include tantalum or a compound of tantalum, or titanium or a compound of titanium. For example, the material of the initial barrier layer 21 may include titanium, titanium nitride, tantalum, or tantalum-nitride. In this embodiment, the material of the initial barrier layer 21 includes high-nitrogen amorphous tantalum.

In this embodiment, the initial barrier layer 21 is formed through atomic layer deposition (ALD). The initial barrier layer 21 covers the part of the top surface of the metal pad 15 exposed, the trench wall of the first trench 16, and the top surface of the remaining part of the dielectric layer 11. The initial barrier layer 21 prevents the subsequently deposited metal material from penetrating into the dielectric layer 11 or the first structure 13 to contaminate other devices.

Next, referring to FIG. 10, the first material is deposited in the first trench 16 through a first process; the first material covers the initial barrier layer 21, to form an initial seed layer 22. When the first material is deposited through the first process, the first material is deposited through a vapor deposition process in an inert gas atmosphere. For example, the semiconductor structure may be placed in a PVD chamber, and nitrogen is injected into the chamber as a protective gas, to form a uniform initial seed layer 22 on the exposed surface of the initial barrier layer 21. In this embodiment, the initial seed layer 22 is formed in a high nitrogen anaerobic atmosphere, and the formed initial seed layer 22 is is free of oxides, so that the surface of the initial seed layer 22 can be subject to the subsequent process without cleaning, thereby reducing process steps and improving processing efficiency.

Next, referring to FIG. 10, the first material is deposited in the first trench 16 through a second process. The first material is grown on the initial seed layer 22. While filling an empty part of the first trench 16, the first material further covers the top surface of the remaining part of the dielectric layer 11 to form an initial metal layer 23. The initial barrier layer 21, the initial seed layer 22, and the initial metal layer 23 jointly form the initial metal interconnect structure 20.

In some embodiments, the first material may include at least one of aluminum, copper, or aluminum-copper. Since aluminum and copper are prone to oxidization, a part of the first material on the top surface of the initial metal layer 23 is oxidized to form a metal oxide 30. The metal oxide 30 is formed in a partial region of the top surface of the initial metal interconnect structure 20.

The second process may be an electroplating process or a sputtering process. The first material is deposited quickly through the electroplating process or sputtering process, so that it takes a short period of time to fill the first trench 16. In some embodiments, the second process is an electroplating process, and after the initial metal interconnect structure 20 is formed, the surface of the initial metal interconnect structure 20 by using a cleaning fluid, to remove the residual electroplating solution. In the cleaning process, a part of the first material on the surface of the initial metal interconnect structure 20 is oxidized to the metal oxide 30, to further increase the area of the region with the metal oxide 30 on the top surface of the initial metal interconnect structure 20.

As shown in FIG. 11, after the initial metal interconnect structure 20 is formed, a relatively large region of the top surface of the first structure 13 on the wafer 100 is covered by the metal oxide 30. If the metal oxide 30 cannot be removed in the subsequent grinding process, the metal oxide 30 will enter the subsequent process together with the wafer 100. The metal oxide 30 may affect the subsequent process, which causes significant abnormalities in the region of the wafer 100 covered by the metal oxide 30, resulting in a decrease in the yield of the wafer 100 or even scrap of the entire wafer 100.

Step S220: Continuously inject a first gas to an exposed surface of the initial metal interconnect structure at a first flow rate for a first duration.

Figure 12:
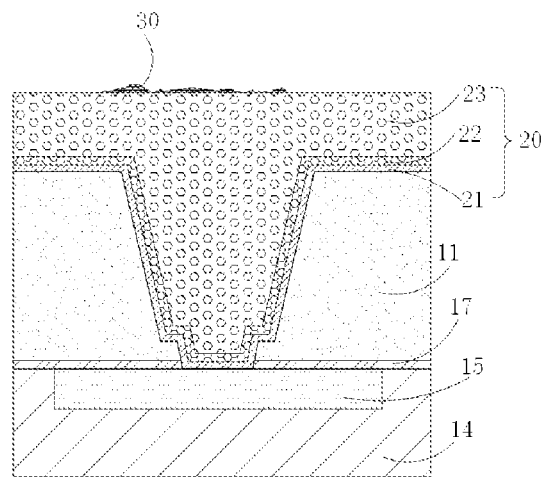
FIG. 12 is a schematic diagram of treating an initial metal interconnect structure by using a first gas according to an exemplary embodiment.

As shown in FIG. 12 with reference to FIG. 10, the first gas injected in this step has reducibility, and the metal oxide 30 on the top surface of the initial metal interconnect structure 20 is reduced to the first material by the first gas, where the first gas includes at least one of CO or $H_2$.

In this embodiment, the initial structure 10 is placed in a PVD chamber, and the first gas is continuously injected into the chamber at a first flow rate for a first duration, where the first gas is a pure CO gas, a pure $H_2$ gas, or a mixture gas of CO and $H_2$. The first gas reacts with the metal oxide 30 on the top surface of the initial metal interconnect structure 20. A part of the metal oxide 30 is reduced to the first material, and the by-product in this process is $CO_2$ and/or $H_2O$. In this embodiment, the initial metal interconnect structure 20 is treated by using the first gas, so that the metal oxide 30 can be reduced to the first material, and the by-product will not attach to the top surface of the initial metal interconnect structure 20, thus not affecting the structural performance of the initial metal interconnect structure 20.

With a higher first flow rate and a longer first duration, a higher percentage of the metal oxide 30 on the top surface of the initial metal interconnect structure is converted into the first material, and a smaller amount of the metal oxide remains on the top surface of the initial metal interconnect structure 20. However, it is found upon research that after injection of the first gas to the exposed surface of the initial metal interconnect structure 20 lasts a period of time, the reaction rate between the metal oxide 30 and the first gas may decrease, thus affecting the overall processing efficiency. Therefore, to ensure that the metal oxide 30 and the first gas has a high reaction rate in the entire reaction process, in this embodiment, the first flow rate is set to 3 sccm to is 10 sccm, and the first duration is set to 15 s to 30 s. In this case, most of the metal oxide 30 on the top surface of the initial metal interconnect structure 20 can be reduced to the first material by the first gas, and the manufacturing time and production cost can be reduced.

In some embodiments, the first material is copper; the metal oxide 30 on the top surface of the initial metal interconnect structure 20 is copper oxide; the first gas injected to the exposed top surface of the initial metal interconnect structure 20 is $H_2$; the first flow rate for injecting $H_2$ may be 3 sccm, 4 sccm, 5 sccm, 6 sccm, 6.5 sccm, 7.5 sccm, 8 sccm, 8.5 sccm, 9 sccm or 10 sccm; the first duration for injection of $H_2$ is 15 s, 18 s, 20 s, 25 s, 28 s or 30 s. After the reduction treatment by $H_2$, 60% to 75% of the copper oxide on the top surface of the initial metal interconnect structure 20 is reduced to copper.

In some embodiments, the first material is aluminum; the metal oxide 30 on the top surface of the initial metal interconnect structure 20 is aluminum oxide; the first gas injected to the exposed top surface of the initial metal interconnect structure 20 is $H_2$; the first flow rate for injecting $H_2$ may be 3 sccm, 3.5 sccm, 4.5 sccm, 5.5 sccm, 7 sccm, 7.2 sccm, 8.8 sccm, 9.2 sccm, 9.8 sccm or 10 sccm; the first duration for injection of $H_2$ is 15 s, 16 s, 19 s, 22 s, 26 s or 30 s. After the reduction treatment by $H_2$, 55% to 65% of the aluminum oxide on the top surface of the initial metal interconnect structure 20 is reduced to aluminum.

Step S230: Continuously spray a first liquid to the exposed surface of the initial metal interconnect structure for a second duration.

Figure 13:
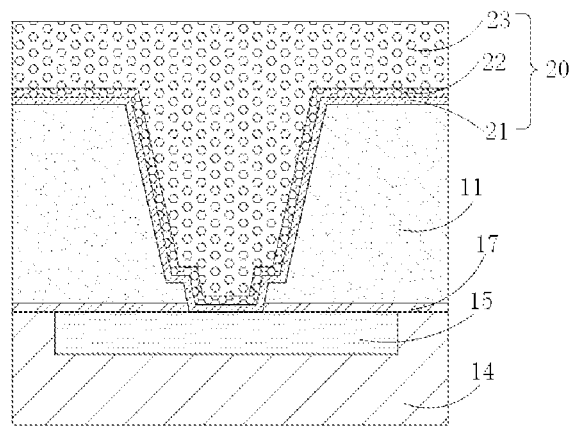
FIG. 13 is a schematic diagram of treating an initial metal interconnect structure by using a first liquid according to an exemplary embodiment.

As shown in FIG. 13 with reference to FIG. 12, in this embodiment, the first liquid includes a weakly acidic liquid; a pH value of the first liquid is specifically between 6 and 7, and specifically, 6<pH<7. The first liquid includes a tiny quantity of $H^+$ ions. The $H^+$ ions reduce the residual metal oxide 30 on the top surface of the initial metal interconnect structure 20 to the first material, to further reduce the metal oxide 30 attached to the top surface of the initial metal interconnect structure 20. For example, the first liquid may be one of a carbonic acid solution, a hypochlorous acid solution, or an acetic acid solution.

In this embodiment, the exposed surface of the initial metal interconnect structure 20 is treated by using the first liquid for the second duration, which is 15 s to 30 s. For example, the second duration may be set to 15 s, 18 s, 20 s, 22 s, 25 s, 28 s or 30 s.

This embodiment is described by using an example in which the first material is copper, the metal oxide 30 on the top surface of the initial metal interconnect structure 20 is copper oxide, and the first liquid is a carbonic acid solution. Deionized water is sprayed to the exposed surface of the initial metal interconnect structure 20, and at the same time, carbon dioxide ($CO_2$) gas is injected into the deionized water. A part of carbon dioxide is dissolved in the deionized water to form a first liquid, where the first liquid is a carbonic acid solution with a low carbonic acid concentration. Carbonic acid dissociates a tiny quantity of ions $H^+$ from carbonic acid. The tiny quantity of $H^+$ ions react with the residual copper oxide on the top surface of the initial metal interconnect structure 20, and a part of the copper oxide is reduced to copper. In this embodiment, carbon dioxide is dissolved in deionized water to form the first liquid. There is no $OH^+$ ion in the first liquid, which can prevent a by-product of the reaction between the copper oxide and $HCO^{3-}$ and $OH^+$ dissociated from carbonic acid from attaching to the top surface of the initial metal interconnect structure 20 to affect the subsequent process.

This embodiment is described by using an example in which the first material is aluminum, the metal oxide 30 on the top surface of the initial metal interconnect structure 20 is aluminum oxide, and the first liquid is an acetic acid solution. The acetic acid solution is sprayed to the exposed surface of the initial metal interconnect structure 20, and the acetic acid solution react with a part of aluminum oxide to reduce a part of aluminum oxide to aluminum.

Step S240: Grind the exposed surface of the initial metal interconnect structure by using a first grinding paste, and remove a partial structure of a top surface of an initial metal layer.

Figure 14:
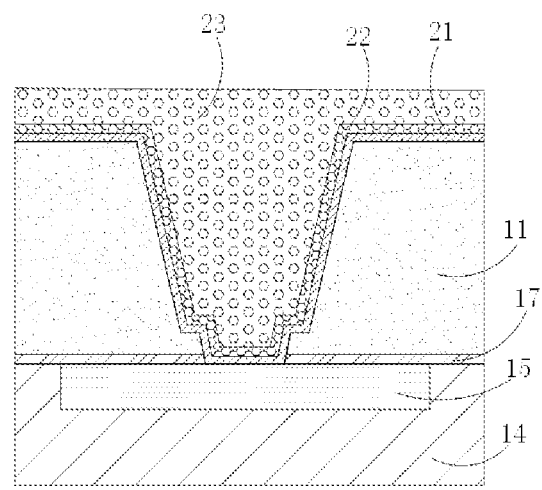
FIG. 14 is a schematic diagram of grinding an initial metal interconnect structure by using a first grinding paste according to an exemplary embodiment.

As shown in FIG. 14 with reference to FIG. 13, through grinding using the first grinding paste, the initial metal layer 23 is removed by a predetermined thickness extending downwards from the top surface of the initial metal interconnect structure 20. The first grinding paste includes first abrasive particles. The first abrasive particle has a particle size of 5 nm to 20 nm. The first abrasive particle has a relatively large particle size, so that the small amount of residual metal oxide 30 on the top surface of the initial metal interconnect structure 20 can be removed through grinding. Moreover, the first grinding paste has a relatively high grinding speed, which can reduce the grinding time of the subsequent grinding with a second grinding paste, and reduce the process difficulty of grinding with the second grinding paste.

In some possible embodiments, the first grinding paste is weakly acid. Under the acid condition, the first abrasive particles can form a stable gel. The first grinding paste grinds the top surface of the initial metal interconnect structure 20 at a uniform speed. The first grinding paste can quickly remove a part of the initial metal layer 23 through etching; moreover, the grinding process of the first grinding paste is accurate and controllable. In this embodiment, a pH value of the first grinding paste is 5.5 to 7. For example, the pH value of the first grinding paste may be 5.5, 5.8, 6, 6.2, 6.5, 6.8 or 7.

Step S250: Grind by using a second grinding paste to remove a part of the initial metal layer and a part of the initial seed layer on the top surface of the remaining part of the dielectric layer, and expose a top surface of an initial barrier layer.

Figure 15:
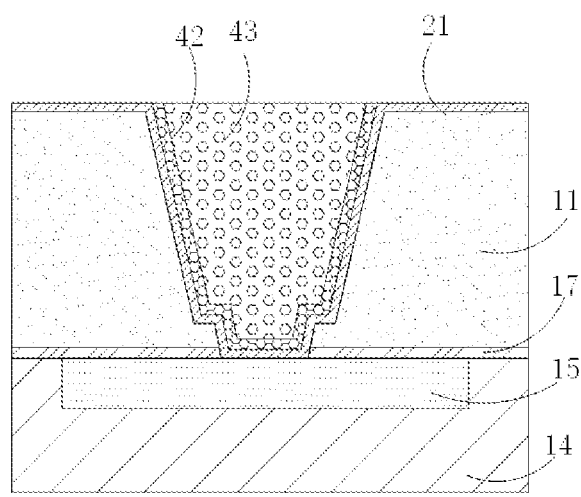
FIG. 15 is a schematic diagram of grinding an initial metal interconnect structure by using a second grinding paste according to an exemplary embodiment.

As shown in FIG. 15 with reference to FIG. 14, the initial metal layer 23 and the initial seed layer 22, which are retained after grinding by the first grinding paste, are removed through grinding by the second grinding paste, so that a part of the initial metal layer 23 and a part of the initial seed layer 22 located on the top surface of the remaining part of the dielectric layer 11 are removed, to expose the initial barrier layer 21 located on the top surface of the remaining part of the dielectric layer 11. The initial metal layer 23 located in the first trench 16 is retained, to form a metal layer 43 of the metal interconnect structure 40, and the initial seed layer 22 located in the first trench 16 is retained to form a seed layer 42 of the metal interconnect structure 40.

The second grinding paste includes second abrasive particles, a particle size of the second abrasive particle is 2 nm to 5 nm, and the particle size of the second abrasive particle is smaller than the particle size of the first abrasive particle. After grinding by the second grinding paste, top surfaces of the metal layer 43 and the seed layer 42 are smoother, which can reduce scratches on the top surfaces of the metal layer 43 and the seed layer 42, so that the formed metal interconnect structure 40 has lower resistance.

In some possible embodiments, the pH value of the first grinding paste is greater than the pH value of the second grinding paste. The second grinding paste is an acidic slurry. Under the acidic condition, the second abrasive particles can form a stable gel, so that the second grinding paste grinds the top surface of the initial metal interconnect structure 20 at a uniform speed. In this embodiment, the pH value of the second grinding paste is 3.5 to 6.5.

In this embodiment, the pH value of the first grinding paste is greater than the pH value of the second grinding paste; the pH value of the first grinding paste is 5.5 to 7, and the pH value of the second grinding paste is 3.5 to 6.5. It may be understood that, when the pH value of the first grinding paste is in a range of 5.5 to 6.5, the pH value of the second grinding paste is in a range smaller than the pH value of the pH value of the first grinding paste. For example, if the pH value of the first grinding paste is 6, the pH value of the second grinding paste is in a range of 3.5 to 6. For example, the pH value of the second grinding paste is 3.5, 4, 5, 5.5 or 6.

After the exposed surface of the initial metal interconnect structure 20 is treated by using the first gas and the first liquid, the metal oxide 30 on the top surface of the initial metal interconnect structure 20 are almost removed completely. However, in the manufacturing process, a small amount of the metal oxide 30 is still attached to the top surface of the initial metal interconnect structure 20. Therefore, in this embodiment, the initial metal interconnect is structure 20 is ground twice by using the first grinding paste and the second grinding paste. Moreover, the particle size of the first abrasive particle is greater than the particle size of the second abrasive particle, and the pH value of the first grinding paste is greater than the pH value of the second grinding paste, so that the relatively hard metal oxide 30 and the partial structure at the top of the initial metal layer 23 are removed by grinding using the first grinding paste. Then, a part of the initial metal layer 23 and a part of the initial seed layer 22 located on the top surface of the remaining part of the dielectric layer 11 are removed by grinding using the second grinding paste. All the metal oxide 30 can be removed, and moreover, the grinding speed can be improved, thereby ensuring the top surface of the formed metal interconnect structure 40 to be smooth and improving the electrical performance of the metal interconnect structure 40.

Step S260: Grind the initial barrier layer by using a third grinding paste, and expose the top surface of the remaining part of the dielectric layer.

Figure 16:
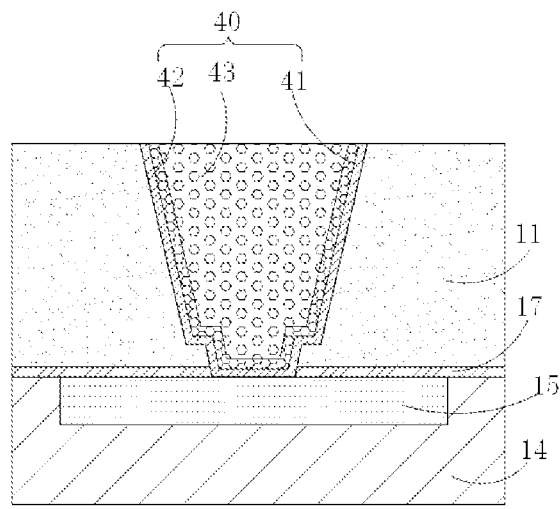
FIG. 16 is a schematic diagram of grinding an initial metal interconnect structure by using a third grinding paste according to an exemplary embodiment.

As shown in FIG. 16 with reference to FIG. 15, the third grinding paste includes third abrasive particles, where a particle size of the third abrasive particle is 15 nm to 50 nm. The third abrasive particle has a relatively large particle size, and the third grinding paste provides a relatively high grinding speed and grinding efficiency, to quickly remove the initial barrier layer 21 covering the top surface of the remaining part of the dielectric layer 11 through grinding. The initial barrier layer 21 located in the first trench 16 is retained to form the barrier layer 41 of the metal interconnect structure 40; the barrier layer 41, the seed layer 42, and the metal layer 43 jointly form the metal interconnect structure 40.

In some possible embodiments, a pH value of the third grinding paste is greater than a pH value of the second grinding paste. To avoid uncontrollability of the grinding process and the damage to the dielectric layer 11 that are caused by an excessively high pH value of the third grinding paste, in this embodiment, the pH value of the third grinding paste is 6 to 7.5.

In this embodiment, the pH value of the third grinding paste is greater than the pH value of the second grinding paste; the pH value of the third grinding paste is 6 to 7.5, and the pH value of the second grinding paste is 3.5 to 6.5. It may be understood that, when the pH value of the second grinding paste is in a range of 6 to 6.5, the pH value of the third grinding paste is in a range larger than the pH value of the pH value of the second grinding paste. For example, if the pH value of the second grinding paste is 6.5, the pH value of the third grinding paste is in a range of 6.5 to 7. For example, the pH value of the third grinding paste may be 6.5, 6.6, 6.8 or 7.

The present disclosure further provides a semiconductor structure manufactured with the foregoing method of manufacturing a semiconductor structure.

After the process implemented by the method of manufacturing a semiconductor structure, as shown in FIG. 16, the formed metal interconnect structure 40 penetrates the dielectric layer 11 to be disposed in the dielectric layer 11. Along a radial direction of the metal interconnect structure 40 (i.e., a horizontal direction shown in FIG. 16), the metal interconnect structure 40 includes the barrier layer 41, the seed layer 42, and the metal layer 43 that are sequentially provided from the exterior to the interior, and there is no metal oxide 30 on the top surface of the metal interconnect structure 40.

Figure 17:
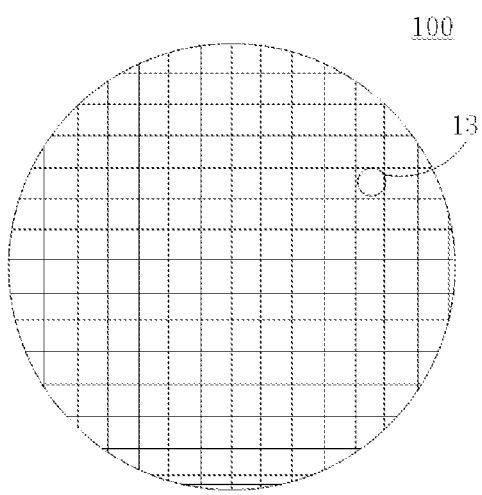
FIG. 17 is a schematic diagram of a wafer after grinding according to an exemplary embodiment.

As shown in FIG. 17 with reference to FIG. 11, after the metal interconnect structure 40 is formed, no metal oxide 30 covers the top surface of the wafer 100 in which the first structure 13 is located.

In the method of manufacturing a semiconductor structure of this embodiment, before the grinding process, a reduction process with the first gas and a cleaning process with the first liquid are added, so that the metal oxide on the top surface of the initial metal interconnect structure are reduced to metal. In addition, corresponding to the material of the initial metal interconnect structure, grinding is carried out by using three different grinding pastes, which improves the grinding speed and ensures that there is no residual metal oxide on the top surface of the formed metal interconnect structure, thus ensuring good electrical performance of the metal interconnect structure. Moreover, no residual metal oxide covers the top surface of the wafer top to enter the next process with the wafer, so that the subsequent process can be performed smoothly, which improves the yield of the finally formed semiconductor structure.

The method of manufacturing a semiconductor structure of this embodiment can be realized by using the existing equipment of the grinding process without setting up additional grinding lines or improving the grinding equipment; the optimized process of the manufacturing method of this embodiment is simple to operate and easy to implement, which is conducive to the industrialization.

The semiconductor structure formed by the manufacturing method of this embodiment can be used to form a memory chip. The memory chip may be used in a dynamic random access memory (DRAM). However, the memory chip may alternatively be applied in a static random-access memory (SRAM), a flash memory (flash EPROM), a ferroelectric random-access memory (FeRAM), a magnetic random access memory (MRAM), a phase change random-access memory (PRAM), or the like.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not is necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A method of manufacturing a semiconductor structure, comprising:
   providing an initial structure, wherein the initial structure comprises a dielectric layer and an initial metal interconnect structure, and the initial metal interconnect structure penetrates the dielectric layer and covers a top surface of the dielectric layer;
   treating an exposed surface of the initial metal interconnect structure by using a first gas, wherein the first gas has a reducibility, and a metal oxide on the exposed surface of the initial metal interconnect structure is reduced;
   cleaning the exposed surface of the initial metal interconnect structure by using a first liquid; and
   grinding to remove a partial structure of the initial metal interconnect structure, wherein a retained part of the initial metal interconnect structure located in the dielectric layer forms a metal interconnect structure;
   wherein the initial structure further comprises a metal pad located at a bottom of the initial metal interconnect structure, and the providing an initial structure comprises:
   providing a first structure, wherein the first structure comprises a media layer, and the metal pad is formed in the media layer;
   forming the dielectric layer, wherein the dielectric layer covers the media layer;
   removing a part of the dielectric layer, and forming a first trench, wherein the first trench exposes a part of a top surface of the metal pad;
   forming an initial barrier layer, wherein the initial barrier layer covers the part of the top surface of the metal pad exposed, a trench wall of the first trench, and a top surface of a remaining part of the dielectric layer;

depositing a first material through a first process, wherein the first material covers the initial barrier layer, and forming an initial seed layer; and depositing the first material through a second process, wherein the first material is grown on the initial seed layer, fills an empty part of the first trench, and covers the top surface of the remaining part of the dielectric layer, and forming an initial metal layer, wherein the initial barrier layer, the initial seed layer, and the initial metal layer jointly form the initial metal interconnect structure;

wherein the grinding to remove a partial structure of the initial metal interconnect structure comprises:

grinding the exposed surface of the initial metal interconnect structure by using a first grinding paste, and removing a partial structure of a top surface of the initial metal layer, wherein the first grinding paste comprises first abrasive particles; and grinding by using a second grinding paste to remove a part of the initial metal layer and a part of the initial seed layer on the top surface of the remaining part of the dielectric layer, and exposing a top surface of the initial barrier layer, wherein the second grinding paste comprises second abrasive particles, wherein a particle size of the first abrasive particle is greater than a particle size of the second abrasive particle, and a pH value of the first grinding paste is greater than a pH value of the second grinding paste.

2. The method of manufacturing a semiconductor structure according to claim 1, wherein the first gas comprises a carbon-containing gas and/or a hydrogen-containing gas.

3. The method of manufacturing a semiconductor structure according to claim 2, wherein the first gas comprises at least one of CO or $H_2$.

4. The method of manufacturing a semiconductor structure according to claim 1, wherein the treating an exposed surface of the initial metal interconnect structure by using a first gas comprises:

continuously injecting the first gas to the exposed surface of the initial metal interconnect structure at a first flow rate for a first duration, wherein the first flow rate is 3 sccm to 10 sccm, and the first duration is 15 s to 30 s.

5. The method of manufacturing a semiconductor structure according to claim 1, wherein the cleaning the exposed surface of the initial metal interconnect structure by using a first liquid comprises:

continuously spraying the first liquid to the exposed surface of the initial metal interconnect structure for a second duration, wherein the second duration is 15 s to 30 s.

6. The method of manufacturing a semiconductor structure according to claim 5, wherein the first liquid comprises a weakly acidic liquid.

7. The method manufacturing of a semiconductor structure according to claim 1, wherein the depositing a first material through a first process comprises:

depositing the first material through a vapor deposition process in an inert gas atmosphere, wherein the first material covers the initial barrier layer, and forming the initial seed layer.

8. The method of manufacturing a semiconductor structure according to claim 1, wherein the depositing the first material through a second process comprises:

depositing the first material through an electroplating process or a sputtering process.

9. The method of manufacturing a semiconductor structure according to claim 1, wherein the first material comprises at least one of copper or aluminum.

10. The method of manufacturing a semiconductor structure according to claim 1, wherein the pH value of the first grinding paste is 5.5 to 7, and the pH value of the second grinding paste is 3.5 to 6.5.

11. The method of manufacturing a semiconductor structure according to claim 1, comprising:

grinding the initial barrier layer by using a third grinding paste, and exposing the top surface of the remaining part of the dielectric layer.

12. The method of manufacturing a semiconductor structure according to claim 11, wherein the third grinding paste comprises third abrasive particles, and a pH value of the third grinding paste is greater than the pH value of the second grinding paste.

* * * * *